(12) United States Patent
Qurashi et al.

(10) Patent No.: US 10,844,511 B2
(45) Date of Patent: *Nov. 24, 2020

(54) METHOD FOR MAKING $In_2O_3$ NANOARRAY AND USE FOR SPLITTING WATER

(71) Applicant: KING FAHD UNIVERSITY OF PETROLEUM AND MINERALS, Dhahran (SA)

(72) Inventors: Ahsanulhaq Qurashi, Dhahran (SA); Ibrahim Khan, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

This patent is subject to a terminal disclaimer.

(21) Appl. No.: 16/554,890

(22) Filed: Aug. 29, 2019

(65) Prior Publication Data
US 2019/0382914 A1 Dec. 19, 2019

Related U.S. Application Data

(63) Continuation of application No. 16/001,188, filed on Jun. 6, 2018, now Pat. No. 10,443,147.

(51) Int. Cl.
*H01M 4/02* (2006.01)
*C30B 7/12* (2006.01)
(Continued)

(52) U.S. Cl.
CPC ............ *C30B 7/12* (2013.01); *C30B 29/16* (2013.01); *C30B 29/60* (2013.01)

(58) Field of Classification Search
CPC ...................................................... H01M 4/02
See application file for complete search history.

(56) References Cited

U.S. PATENT DOCUMENTS 8,465,691 B1   6/2013  Zhou et al.

FOREIGN PATENT DOCUMENTS

| CN | 103628106 A | 3/2014 |
| CN | 102634816 B | 11/2014 |
| WO | 2011/137404 A2 | 11/2011 |

OTHER PUBLICATIONS

Zehng et al. ("Fabrication and optical absorption of ordered indium oxide nanowire arrays embedded in anodic alumina membranes" Chemical Physics Letters 334 (2001) 298-302).*

(Continued)

*Primary Examiner* — Jacob B Marks
(74) *Attorney, Agent, or Firm* — Oblon, McClelland, Maier & Neustadt, L.L.P.

(57) ABSTRACT

A method of forming a one-dimensional nanoarray of $In_2O_3$ nanowires on indium foil is disclosed. The nanowires of $In_2O_3$ have diameters of 30 nm-50 nm and lengths of 100 nm-200 nm, and are attached to and substantially perpendicular to the surface of the indium foil. The $In_2O_3$ nanoarray may have a nanowire density of 200-300 nanowires per $\mu m^2$ indium foil and a band gap energy of 2.63-3.63 eV. The $In_2O_3$ nanoarray may be formed by anodization of indium foil in an electrochemical cell subjected to a voltage of 15-25 V at room temperature.

9 Claims, 10 Drawing Sheets

(51) Int. Cl.
*C30B 29/60* (2006.01)
*C30B 29/16* (2006.01)

(56) References Cited

OTHER PUBLICATIONS

Ilkay Şişman ; Template-Assisted Electrochemical Synthesis of Semiconductor Nanowires ; Nanowires—Implementations and Applications ; InTech, Jul. 18, 2011; 19 Pages.

Ho, W. H., et al. ; Preparation and characterization of indium oxide film by electrochemical deposition ; Thin Solid Films, vol. 498, Issues 1-2 ; Mar. 1, 2006 ; 3 Pages; Abstract only.

Zehng et al. "Fabrication and optical absorption of ordered indium oxidenanowire arrays embedded in anodic alumina membranes" Chemical Physics Letters 334 (Feb. 2001) 298-302.

* cited by examiner

METHOD FOR MAKING $In_2O_3$ NANOARRAY AND USE FOR SPLITTING WATER

CROSS-REFERENCE TO RELATED APPLICATIONS

The present application is a Continuation of Ser. No. 16/001,188, now allowed, having a filing date of Jun. 6, 2018.

BACKGROUND OF THE INVENTION

Technical Field

The present invention relates to an anodization method for producing one-dimensional (1-D) nanoarrays of $In_2O_3$.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Recently, $In_2O_3$ (indium(III) oxide, or indium sesquioxide) has attracted considerable attention as a useful material due to its promising semiconductor and energy harvesting applications in photo-electrochemical systems. Various methods have been explored for the synthesis of different $In_2O_3$ nanostructures, including sol-gel methods, hydrothermal synthesis, chemical vapor deposition, and more traditional wet chemistry techniques.

However, these methods tend to either require high energy consumption or are not able to reliably produce a regular array of nanostructures.

In view of the foregoing, one objective of the present invention is to provide an anodization method of forming one-dimensional (1-D) $In_2O_3$ nanoarrays on an indium foil substrate. The one-step anodization method allows reliable synthesis of regular nanoarrays over a large area while using a low input of energy. The $In_2O_3$ nanoarrays formed by the method may be used in a photo-electrochemical cell or within an electronic component such as a capacitor or semiconductor.

BRIEF SUMMARY OF THE INVENTION

According to a first aspect, the present disclosure relates to a method for producing a nanoarray of $In_2O_3$ nanowires on indium foil, which involves subjecting an electrochemical cell to 15-25 V. The electrochemical cell has a working electrode comprising indium foil in contact with an electrolyte solution and a counter electrode also in contact with the electrolyte solution. In this method, nanowires of $In_2O_3$ are grown on the indium foil, forming the $In_2O_3$ nanoarray. In this $In_2O_3$ nanoarray, an end of each nanowire is attached to the indium foil, and the longitudinal axis of each nanowire is substantially perpendicular to the indium foil.

In one embodiment, the nanowires have substantially circular cross-sections.

In one embodiment, the nanowires have diameters of 30-50 nm and lengths of 100-200 nm.

In one embodiment, the nanowires comprise $In_2O_3$ in a cubic crystal phase.

In one embodiment, the $In_2O_3$ nanoarray has a nanowire density of 200-300 nanowires per $\mu m^2$ indium foil.

In one embodiment, the $In_2O_3$ nanoarray has a band gap energy of 2.63-3.63 eV.

In one embodiment, the electrolyte solution has a temperature of 20-30° C.

In one embodiment, the electrolyte solution comprises polyethylene glycol at a weight percentage of 1-8 wt % relative to a total weight of the electrolyte solution.

In one embodiment, the electrolyte solution comprises one or more electrolytes at a concentration of 0.2-1.0 M.

In one embodiment, the electrolyte solution comprises at least one electrolyte selected from the group consisting of chromic acid, oxalic acid, sulfuric acid, phosphoric acid, ammonium fluoride, and sodium fluoride.

In a further embodiment, the electrolyte solution comprises sodium fluoride.

In one embodiment, before the subjecting, the electrolyte solution is substantially free of an aqueous form of In.

In one embodiment, the electrolyte solution is stirred during the subjecting.

In one embodiment, the electrochemical cell further comprises a reference electrode.

In one embodiment, the reference electrode is a saturated calomel electrode.

In one embodiment, the counter electrode comprises gold, platinum, or carbon.

In a further embodiment, the counter electrode comprises platinum.

In one embodiment, the counter electrode is in the form of a rod or wire.

In one embodiment, the electrochemical cell is subjected to a voltage that does not vary by more than 5% of an average value throughout the subjecting.

In one embodiment, the indium foil in contact with the electrolyte solution has a length to width ratio of 1:1-2.5:1.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
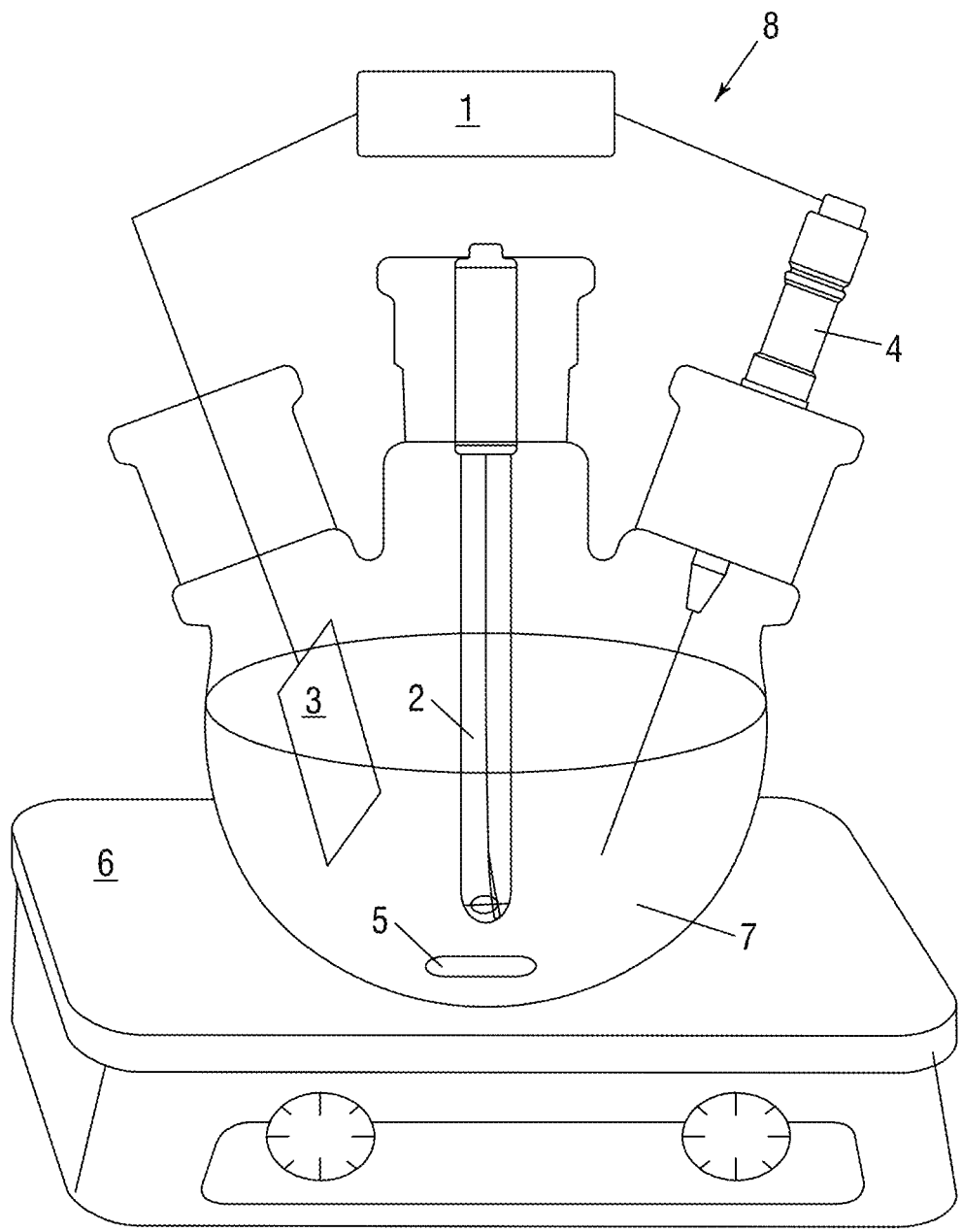
FIG. 1 is an example setup of an electrochemical cell for a three-electrode anodization of the $In_2O_3$ nanoarray.

Embodiments of the present disclosure will now be described more fully hereinafter with reference to the accompanying drawings, in which some, but not all embodiments of the disclosure are shown.

The present disclosure will be better understood with reference to the following definitions. As used herein, the words "a" and "an" and the like carry the meaning of "one or more." Within the description of this disclosure, where a numerical limit or range is stated, the endpoints are included unless stated otherwise. Also, all values and subranges within a numerical limit or range are specifically included as if explicitly written out.

For polygonal shapes, the term "diameter," as used herein, and unless otherwise specified, refers to the greatest possible distance measured from a vertex of a polygon through the center of the face to the vertex on the opposite side. For a circle, an oval, and an ellipse, "diameter" refers to the greatest possible distance measured from one point on the shape through the center of the shape to a point directly across from it.

As used herein, "compound" is intended to refer to a chemical entity, whether as a solid, liquid, or gas, and whether in a crude mixture or isolated and purified.

In addition, the present disclosure is intended to include all isotopes of atoms occurring in the present compounds and complexes. Isotopes include those atoms having the same atomic number but different mass numbers. By way of general example and without limitation, isotopes of hydrogen include deuterium and tritium. Isotopes of carbon include $^{13}C$ and $^{14}C$. Isotopes of oxygen include $^{16}O$, $^{17}O$, $^{18}O$, and others. Isotopes of indium include, but are not limited to, $^{113}In$ and $^{115}In$. Isotopically-labeled compounds of the disclosure can generally be prepared by conventional techniques known to those skilled in the art or by processes analogous to those described herein, using an appropriate isotopically-labeled reagent in place of the non-labeled reagent otherwise employed.

According to a first aspect, the present disclosure relates to a method for producing an $In_2O_3$ nanoarray on indium foil, which involves subjecting an electrochemical cell to 15-25 V, preferably 17-23 V, more preferably 18-22 V. However, in some embodiments, the electrochemical cell may be subjected to less than 15 V or more than 25 V. The electrochemical cell has a working electrode comprising indium (In) foil in contact with an electrolyte solution and a counter electrode also in contact with the electrolyte solution. The counter electrode may also be called an auxiliary electrode. In this method, nanowires of $In_2O_3$ are grown on the indium foil, forming the $In_2O_3$ nanoarray. In this $In_2O_3$ nanoarray, an end of each nanowire is attached to the indium foil, and the longitudinal axis of each nanowire is substantially perpendicular to the indium foil.

In one embodiment, the nanowires have diameters of 30-50 nm, preferably 32-48 nm, more preferably 35-45 nm and lengths of 100-200 nm, preferably 110-190 nm, more preferably 120-180 nm. The $In_2O_3$ nanowires in these forms may be attached to or detached from the working electrode of indium foil. Preferably the $In_2O_3$ nanowires are attached to the working electrode of indium foil. Preferably the nanowires comprise greater than 90 wt %, preferably greater than 95 wt %/o, preferably greater than 99 wt % $In_2O_3$, relative to a total weight of the nanowires. In one embodiment, the nanowires may comprise other forms of indium oxide, such as indium(I) oxide, indium(II) oxide, or the nanowires may comprise metallic indium. Where the nanowires comprise compounds other than $In_2O_3$, those compounds may be present at a weight percentage of 0.001-10 wt %, preferably 0.05-5 wt %, more preferably 0.1-2 wt %, relative to a total weight of the nanowires. However, in some embodiments, the non-$In_2O_3$ compounds may be present at a weight percentage of less than 0.001 wt % or greater than 10 wt % relative to a total weight of the nanowires.

As defined here, nanowires are elongated shapes with diameters or widths of 100 nm or less, preferably 80 nm or less, more preferably 60 nm or less. Here, the nanowires being "elongated" means that an aspect ratio of the longest dimension (length) of a nanowire to the next longest dimension (width) of the nanowire is 3:1-20:1, preferably 4:1-15:1, more preferably 4:1-12:1. In some embodiments, nanowires may be less elongated, with an aspect ratio of less than 3:1, or more elongated, with an aspect ratio of 20:1 or greater. Preferably the nanowires are substantially cylindrical. In this embodiment, a cross-section of a nanowire has a circular or elliptical shape, or some other rounded shape. Preferably the nanowires have substantially circular cross-sections. Here, the nanowires have sides that curve in a plane perpendicular to the central axis. In other embodiments, the nanowires may be polygonal or prismatic, having planar sides and cross-sections that are polygons, for instance, rectangular cross-sections. In alternative embodiments, the sides of the nanowires may taper, curve, or be angled towards a single point. The longitudinal axis of each nanowire being substantially perpendicular to the indium foil means that the central axis or length of each nanowire forms a smallest angle of 60°-90°, preferably 700-90°, more preferably 75°-90°, even more preferably 80°-90° with the surface of the indium foil, where a smallest angle of 90° is exactly perpendicular. Preferably, the lengths or central axes of adjacent nanowires are parallel with one another. In other embodiments, the lengths or central axes of adjacent nanowires may be parallel with one another while forming a smallest angle of 60°-80°, preferably 62°-75°, more preferably 630-700 with the plane of the indium foil surface.

In another embodiment, nanowires may be attached to the indium foil by one end, but may be bent or curved and not substantially perpendicular to the indium foil surface. For example, FIG. 3C is an FESEM image that shows a proportion of nanowires that are bent or curved. In one embodiment, an $In_2O_3$ nanoarray may comprise a mixture of nanowires that are substantially perpendicular to the indium foil surface while other nanowires are curved or bent without being substantially perpendicular to the indium foil surface. For example, an $In_2O_3$ nanoarray may comprise 60-90%, preferably 70-85%, of nanowires that are substantially perpendicular to the indium foil in relation to a total number of nanowires, with the remaining percentage being curved or bent. In one embodiment, nanowires with greater elongation lengths or greater length to width ratios may have a greater tendency of being curved or bent. In another embodiment, nanowires may be curved or bent in such a way that a line connecting their base to their distal end is substantially perpendicular, while a side of the nanowire is not substantially perpendicular.

In one embodiment, the nanowires may be hollow, similar to boxes or nanotubes. Preferably, however, the nanowires are solid. In some embodiments, the nanowires may be considered nanowhiskers, nanorods, nanospikes, nanostrings, nanofilaments, nanopicks, nanopegs, nanopins, nanostakes, nanopillars, nanoprisms, nanofibers, nanotubes, or nanocylinders. In other embodiments, two or more nanowires side by side may merge together towards the indium foil surface.

The ends of the nanowires may have tips in a variety of configurations. Where the nanowires are attached to the indium foil, these tips refer to the unattached ends of the nanowires, or the ends distal to the indium foil. In one embodiment, the nanowires may have flat tips that are either perpendicular to the sides of the nanowires (as in a right cylinder) or tilted at an angle relative to the sides (as in a truncated cylinder). In another embodiment, the nanowires may have curved tips, such as hemispherical or dome-shaped tips. In one embodiment, the nanowires have conical tips, with curved edges leading towards a blunt point. This shape may be similar to the pointed end of an ellipsoid or an egg. FIGS. 3B-3D show example images of nanowires with generally flat tips. Preferably, the nanowires are substantially rotationally symmetric around their central axis, as shown in FIGS. 3B and 3D.

Preferably, in one embodiment, the nanowires have a uniform shape. Alternatively, the shape may be non-uniform. As used herein, the term "uniform" refers to an average consistent shape that differs by no more than 10%, by no more than 5%, by no more than 4%, by no more than 3%, by no more than 2%, by no more than 1% of the distribution of nanowires having a different shape. As used herein, the term "non-uniform" refers to an average consistent shape that differs by more than 10% of the distribution of nanowires having a different shape. In one embodiment, the shape is uniform and at least 90% of the nanowires are substantially cylindrical, and less than 10% are polygonal or substantially prismatic. In another embodiment, the shape is non-uniform and less than 90% of the nanowires are substantially cylindrical, and greater than 10% are polygonal or substantially prismatic. In one embodiment, the nanowires of the present disclosure are monodisperse, having a coefficient of variation or relative standard deviation, expressed as a percentage and defined as the ratio of the particle size standard deviation ($\sigma$) to the particle size mean ($\mu$) multiplied by 100, of less than 25%, preferably less than 10%, preferably less than 8%, preferably less than 6%, preferably less than 5%, preferably less than 4%, preferably less than 3%, preferably less than 2%. In a preferred embodiment, the nanowires of the present disclosure are monodisperse having a size distribution ranging from 80% of the average nanowire size to 120% of the average nanowire size, preferably 90-110%, preferably 95-105% of the average nanowire size.

Nanoparticle characterization may be used to establish understanding and control of the $In_2O_3$ nanoarray anodization and application. In one embodiment, it is envisioned that characterization is done using a variety of techniques. Exemplary techniques include, but are not limited to, electron microscopy (TEM, SEM), atomic force microscopy (AFM), ultraviolet-visible spectroscopy (UV-Vis), dynamic light scattering (DLS), X-ray photoelectron spectroscopy (XPS), X-ray fluorescence (XRF), powder X-ray diffraction (XRD), energy dispersive X-ray spectroscopy (EDX), thermogravimetric analysis (TGA), Fourier transform infrared spectroscopy (FTIR), matrix-assisted laser desorption/ionization time-of-flight mass spectrometry (MALDI-TOF), Rutherford backscattering spectrometry (RBS), dual polarization interferometry, time-of-flight secondary ion mass spectrometry (ToF-SIMS), electron energy loss spectroscopy (EELS), high-angle annular dark field (HAADF), near infrared (NIR) spectroscopy, nuclear magnetic resonance (NMR), or combinations thereof.

In one embodiment, the $In_2O_3$ nanoarray has a nanowire density of 200-300, preferably 220-280, more preferably 230-270, even more preferably 235-265 nanowires per $\mu m^2$ indium foil. In alternative embodiments, the nanowire density may be smaller than 200 or greater than 300 nanowires per $\mu m^2$ indium foil. In one embodiment, the nanowires are attached to the indium foil in a substantially regular array, wherein any 1 $\mu m^2$ region of the indium foil comprises 85%-99%, preferably 87-98%, more preferably 90-98% nanowires in a close-packed array, and a packing density that does not vary by more than 10%, preferably by no more than 7% of the bulk average nanowire density.

In one embodiment, the nanowires are discrete and separated by inter-nanowire gaps or inter-nanowire distances of 1-50 nm, preferably 3-45 nm, preferably 5-40 nm, preferably 6-38 nm, preferably 7-35 nm, preferably 8-32 nm, most preferably 9-30 nm. The inter-nanowire distance refers to the shortest distance between the outer edges of two neighboring nanowires. In a preferred embodiment, the nanowires of the present disclosure have an average surface to surface inter-nanowire distance of less than 200% of their average diameter, preferably less than 150% of their average diameter, preferably less than 100% of their average diameter, preferably less than 50% of their average diameter, preferably less than 25% of their average diameter, preferably less than 10% of their average diameter, preferably less than 5% of their average diameter. In one embodiment, the nanowires may have tapered or curved tips, and may be touching or merging with one another (that is, an inter-nanowire gap of 0 nm) where they attach to the indium foil. In one embodiment, the inter-nanowire gaps may be in the form of pores or depressions where indium of the indium foil was removed during the anodization process. These pores or depressions may have diameters similar to the lengths of the inter-nanowire distances listed above. The pores or depressions may have a maximum depth of 20-500 nm, preferably 30-400 nm, more preferably 40-380 nm, even more preferably 45 nm-350 nm below that of the original plane of the indium foil surface. The pores or depressions may have a greatest width or diameter of 20 nm-1 $\mu m$, preferably 30-500 nm, more preferably 35-450 nm, even more preferably 37-420 nm. In one embodiment, the pores may be shaped with lengths, diameters, and/or edges similar to the geometry of nanowires, described previously, being inverted into the indium foil.

In one embodiment, inter-nanowire gaps may be elongated, leading to the formation of grooves or channels between nanowires. These grooves or channels may have widths of 10-25 nm, preferably 12-20 nm, and lengths of 90-400 nm, preferably 100-350 nm. An uninterrupted wall of a channel may be formed by 3-12, preferably 4-8 adjacent nanowires. In one embodiment, grooves or channels may be longer or more common with an array having a higher packing regularity and/or a shorter length of nanowires. In one embodiment, a row of nanowires may be merged together closer to the indium foil, forming a shape similar to a picket fence.

In one embodiment, the nanowires comprise $In_2O_3$ in a cubic crystal phase. For example, the $In_2O_3$ may be in a cubic crystal phase similar to the crystal phase of bixbyite $((Mn,Fe)_2O_3)$. The cubic crystal phase of $In_2O_3$ may have 16 molecules (i.e. molecular weights) of $In_2O_3$ per unit cell and an $1a3$ space group symmetry. The density of crystal phase $In_2O_3$ may be 6.8-7.3 g/cm$^3$, preferably 7.0-7.2 g/cm$^3$. In alternative embodiments, the $In_2O_3$ may be in a different crystal phase or may be in an amorphous phase, for example, the $In_2O_3$ may be in a rhombohedral phase. In one embodiment, the $In_2O_3$ of a single nanowire may be in a mixture of crystal and amorphous phases. For example, a single nanowire may have 2-20 wt %, preferably 3-15 wt % $In_2O_3$ in an amorphous phase relative to a total weight of the nanowire, with cubic crystal phase $In_2O_3$ as the remaining phase. Preferably, the crystal phase may be determined by analyzing X-ray diffraction patterns.

Figure 7A:
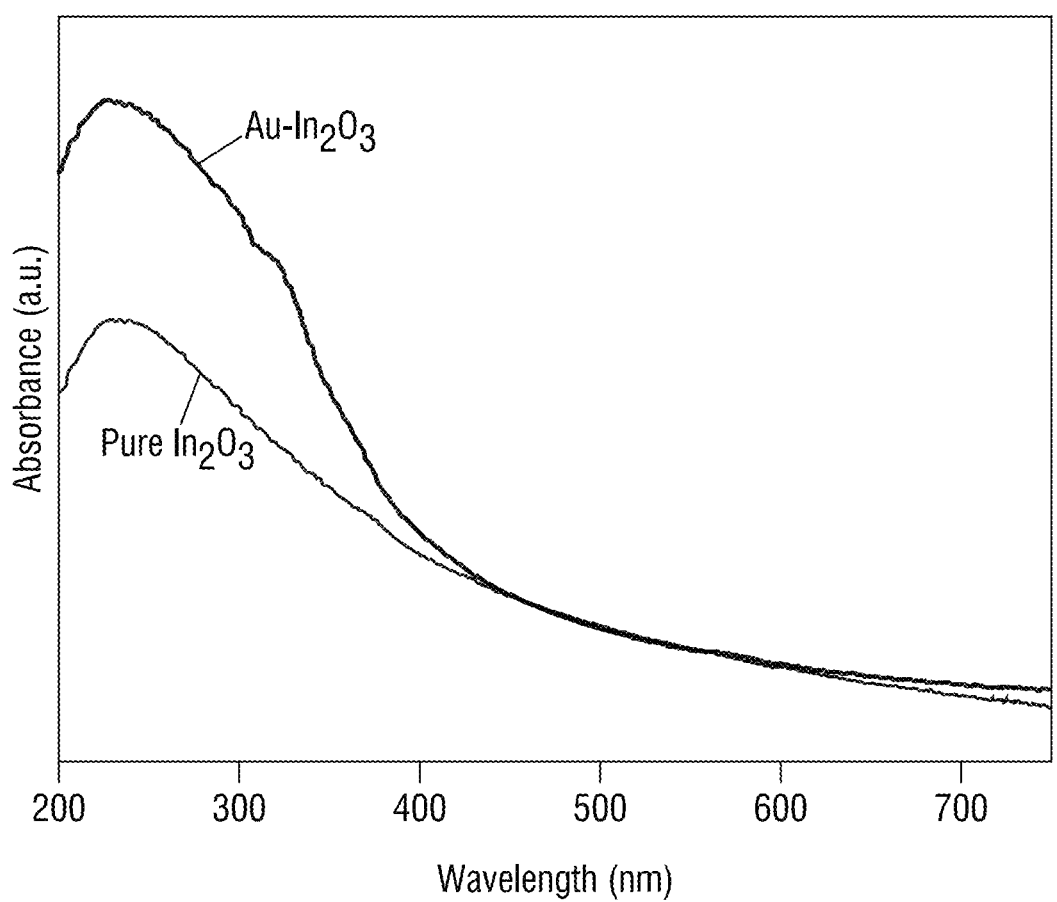
FIG. 7A is a UV-Vis adsorption spectrum of the $In_2O_3$ nanoarray and a gold-coated $In_2O_3$ nanoarray.
Figure 7B:
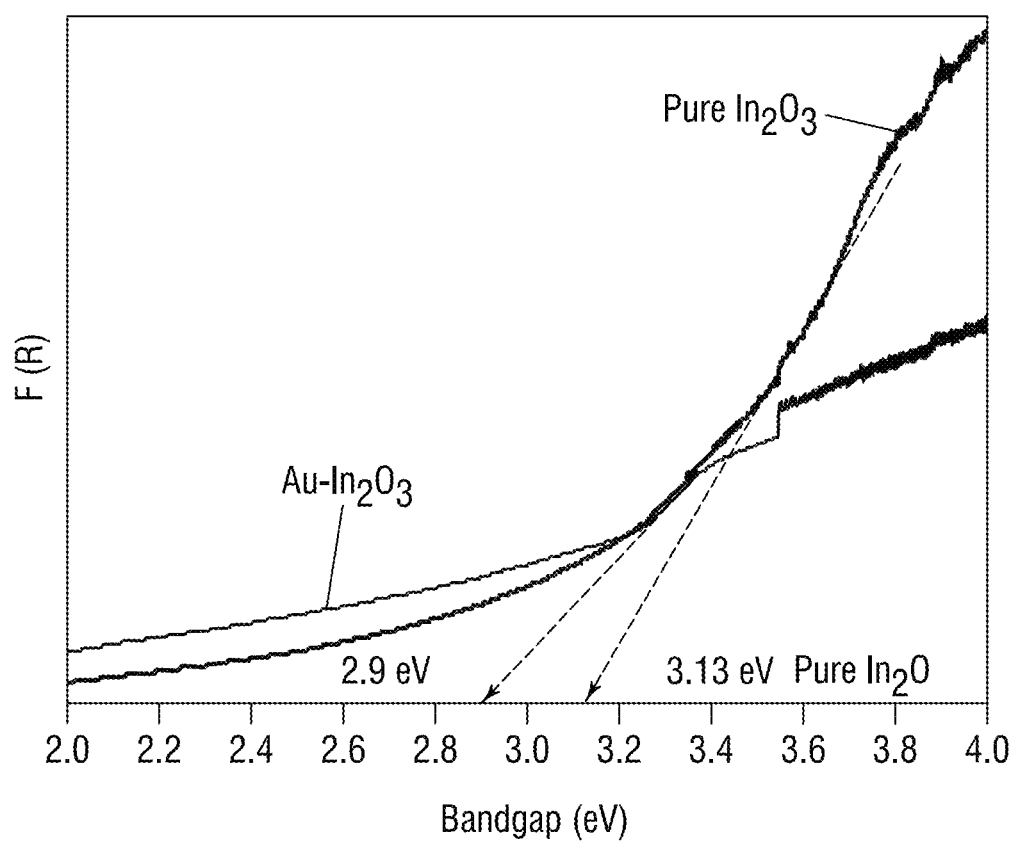
FIG. 7B is the spectrum from FIG. 7A calculated for band gap energies.

In one embodiment, the $In_2O_3$ nanoarray has a band gap energy of 2.63-3.63 eV, preferably 2.83-3.43 eV, more preferably 3.03-3.23 eV. However, in alternative embodiments, the $In_2O_3$ nanoarray may have a band gap energy of less than 2.63 eV or greater than 3.63 eV. The band gap energy may be influenced by the density of the nanowires, their geometry, their dimensions, their regularity, and/or the type of indium foil substrate. In one embodiment, a person having ordinary skill in the art may be able to adjust the band gap energy to different values by changing those characteristics of the $In_2O_3$ nanoarray. In one embodiment, the band gap energy may be determined from a UV-Vis absorption spectrum, as shown in FIGS. 7A and 7B.

In one embodiment, the anodization method may be used to make $In_2O_3$ nanoarrays having dimensions different than those mentioned above. For instance, $In_2O_3$ nanowires may be produced that have diameters smaller than 30 nm or greater than 50 nm, and/or lengths smaller than 100 nm or greater than 200 nm. In a related embodiment, the anodization method may be used to make an $In_2O_3$ nanoarray having a nanowire density of less than 220 or greater than 300 nanowires per µm$^2$ indium foil.

In a related alternative embodiment, the method may be used to make $In_2O_3$ in the form of nanostructures that are not nanowires. For instance, the $In_2O_3$ may be made in the form of nanoparticles, nanosheets, nanoplatelets, nanocrystals, nanospheres, nanorectangles, nanotriangles, nanopentagons, nanohexagons, nanoprisms, nanodisks, nanocubes, nanoribbons, nanorods, nanobeads, nanotoroids, nanodiscs, nanolaminas, nanoshells, nanogranules, nanowhiskers, nanoflakes, nanofoils, nanopowders, nanoboxes, nanostars, tetrapods, nanobelts, nano-urchins, nanofloweres, etc. and mixtures thereof.

In some embodiments, the electrochemical cell may be subjected to the previously mentioned voltages for 1-3 hours, preferably 1.5-2.5 hours, more preferably 1.8-2.2 hours, or about 2 hours. In other embodiments, however, the electrochemical cell may be subjected to those voltages for a time shorter than 1 hour or longer than 3 hours. In alternative embodiments, the subjecting may use a lower voltage for a longer time, or a higher voltage for a shorter time, in order to achieve similar results.

This electrochemical method as discussed above may be considered an anodization process for producing the $In_2O_3$ nanoarray. As defined here, anodization is an electrolytic passivation process used to increase the thickness of a metal oxide layer on the surface of a metal. Here, for example, the metal is indium, and the metal oxide is indium oxide ($In_2O_3$).

During anodization of a metal, the metal oxide layer is grown by passing a direct current through an electrolytic solution, with the metal of interest serving as the anode (the positive electrode). The electrical current releases hydrogen at the cathode (the negative electrode) and oxygen at the surface of the anode, creating a build-up of the metal oxide.

Anodization is usually performed in an acidic electrolyte solution, which slowly dissolves the formed metal oxide, counteracting its deposition. However, in some embodiments a basic electrolyte solution may be used. This dual action of deposition and dissolution leads to the creation of nanostructures, such as nanopores and nanoparticles. In general, the metal oxide is both grown down into the metal surface and out from the metal surface by similar thicknesses. In addition, if a metal is anodized on all sides, where the metal is of the same type and in contact with the electrolyte solution, then all linear dimensions will increase by approximately the same layer thickness.

The nanopores may have diameters of 5-200 nm, preferably 10-150 nm, more preferably 12-50 nm, and these nanopores allow the electrolyte solution and current to reach the un-reacted metal and continue growing the metal oxide layer to greater thicknesses beyond those produced by just autopassivation. However, in some embodiments, following the anodization process, these nanopores may permit air or water to reach un-reacted metal and initiate corrosion if not sealed. Thus, for certain anodized metals, a protective dye and/or corrosion inhibitor may be applied. In some embodiments, crevices, cracks, or depleted regions larger than the nanopores discussed above may be formed during the anodization process.

Several parameters of an anodization process may be modified to lead to different sizes and morphologies of nanostructures. These parameters include, but are not limited to, electrolyte type and concentration, pH, solution temperature, current, voltage, stirring rate, electrode surface area, electrode type, and exposure time. A variable DC current may be applied at a fixed voltage, or a fixed DC current may be applied at a variable voltage. In some instances, AC current or pulsed current may be used. A person having ordinary skill in the art may be able to adjust these and other parameters, to achieve different desired nanostructures.

The working electrode may be considered the anode, and the counter electrode may be considered the cathode. Thus, in one embodiment, the working electrode is the positive electrode, and the counter electrode is the negative electrode. However, in an alternative embodiment where the electrochemical cell is subjected to alternating current (AC), or the polarity of the electrochemical cell is otherwise switched, the working electrode may momentarily become the negative electrode while the counter electrode momentarily becomes the positive electrode.

In one embodiment, the electrolyte solution has a temperature of 20-30° C., preferably 22-28° C., more preferably 22-27° C., or about room temperature. In another embodiment, the electrochemical cell is operated while using a cooling mechanism, such as a water bath, ice packs, cooled air, or tubing containing a flowing coolant. In other embodiments, the electrolyte solution may have a temperature lower than 20° C. or greater than 30° C., and in a further embodiment, the electrochemical anodization to form the nanowires may occur successfully at those temperatures. Preferably the electrochemical cell is maintained at atmospheric pressures, however, in alternative embodiments, the pressure may be decreased below or increased above atmospheric pressures.

Preferably, to maintain uniform concentrations and/or temperatures of the electrolyte solution, the electrolyte solution may be stirred or agitated during the step of the subjecting. The stirring or agitating may be done intermittently or continuously. This stirring or agitating may be by a magnetic stir bar, a stirring rod, an impeller, a shaking platform, a pump, a sonicator, a gas bubbler, or some other device. Preferably the stirring is done by an impeller or a magnetic stir bar.

In one embodiment, the electrochemical cell is a vessel having an internal cavity for holding the electrolyte solution. The vessel may be cylindrical, cuboid, frustoconical, spherical, or some other shape. The vessel walls may comprise a material including, but not limited to, glass, polypropylene, polyvinyl chloride, polyethylene, and/or polytetrafluoroethylene, and the vessel walls may have a thickness of 0.1-3 cm, preferably 0.1-2 cm, more preferably 0.2-1.5 cm. The internal cavity may have a volume of 2 mL-100 mL, preferably 2.5 mL-50 mL, more preferably 3 mL-20 mL. In another embodiment, for instance, for small scale or benchtop anodization, the internal cavity may have a volume of 100 mL-50 L, preferably 1 L-20 L, more preferably 2 L-10 L. In another embodiment, for instance, for pilot plant anodization, the internal cavity may have a volume of 50 L-10,000 L, preferably 70 L-1,000 L, more preferably 80 L-2,000 L. In another embodiment, for instance, for industrial plant-scale anodization, the internal cavity may have a volume of 10,000 L-500,000 L, preferably 20,000 L-400,000 L, more preferably 40,000 L-100,000 L. In one embodiment, one or more electrochemical cells may be connected to each other in parallel and/or in series. In another embodiment, the electrolyte solution may be in contact with more than one working electrode and/or more than one counter electrode.

In one embodiment, the electrolyte solution comprises at least one electrolyte selected from the group consisting of chromic acid, oxalic acid, sulfuric acid, phosphoric acid, ammonium fluoride, and sodium fluoride. Preferably, the electrolyte solution comprises sodium fluoride. In one embodiment, the electrolyte solution comprises one or more electrolytes at a concentration of 0.2-1.0 M, preferably 0.3-0.8 M, more preferably 0.4-0.6 M. However, in some embodiments, the electrolyte concentration may be less than 0.2 M or greater than 1.0 M. In another embodiment, the electrolyte solution may comprise two or more electrolytes at different ratios to one another. For instance, a molar ratio of a first electrolyte to a second electrolyte may be 1:10-10:1, preferably 1:5-5:1, more preferably 1:2-2:1, or, in one embodiment, about 1:1. In other embodiments, the electrolyte solution may comprise trichloroacetic acid, gluconic acid, formic acid, perchloric acid, hydrochloric acid, nitric acid, ammonium sulfate, ammonium chloride, sodium chloride, potassium chloride, toluenesulfonic acid, benzenesulfonic acid and/or tartaric acid at a concentration of 0.01-1 M, preferably 0.05-0.8 M, more preferably 0.1-0.7 M. In one embodiment, the electrolyte solution may have a pH of 1.0-7.0, preferably 1.2-6.0, more preferably 1.5-5.0. In another embodiment, the electrolyte solution may have a pH of 7.0-13.0, preferably 7.8-11.0, more preferably 8.5-10.0, though in some embodiments, the pH may be less than 1.0 or greater than 13.0. In one embodiment, the subjecting may be carried out starting with one type of electrolyte solution, and then changed to a different type of electrolyte solution.

In one embodiment, before the subjecting, the electrolyte solution is substantially free of an aqueous form of indium, meaning that the electrolyte solution contains 10 ppb or less, preferably 5 ppb or less, more preferably 1 ppb or less of indium. In this embodiment, the electrolyte solution is substantially free of a dispersion of indium or dissolved indium in the form of atomic In, In(I), In(II), In(III) or a compound containing In. Here, the only indium present in the entire system before subjecting the electric potential is the indium of the indium foil. In other words, the nanowires are formed only from indium that originates from the indium foil. However, in an alternative embodiment, aqueous In(I), In(II), and/or In(III) may be present in the electrolyte solution before the subjecting, for example, by mixing an indium salt such as $InCl_3$. In another alternative embodiment, colloidal indium or indium nanoparticles may be added to the electrolyte solution before the subjecting. In these alternative embodiments, where In(I), In(II), and/or In(III) may be present in the electrolyte solution before the subjecting, the electrochemical process that grows the $In_2O_3$ nanoarray may not necessarily be anodization, but some other electrodeposition process.

In one embodiment, the electrolyte solution does not contain a surfactant. However, in alternative embodiments, a surfactant may be present to direct the anodization and growth of the nanowires, thus influencing their geometry.

Exemplary ionic surfactants include, but are not limited to, (1) anionic (based on sulfate, sulfonate or carboxylate anions), for example, perfluorooctanoate (PFOA or PFO), perfluorooctanesulfonate (PFOS), sodium dodecyl sulfate (SDS), ammonium lauryl sulfate, and other alkyl sulfate salts, sodium laureth sulfate (also known as sodium lauryl ether sulfate (SLES)), alkyl benzene sulfonate, soaps, and fatty acid salts; (2) cationic (based on quaternary ammonium cations), for example, cetyl trimethylammonium bromide (CTAB) (also known as hexadecyl trimethyl ammonium bromide), and other alkyltrimethylammonium salts, cetylpyridinium chloride (CPC), polyethoxylated tallow amine (POEA), benzalkonium chloride (BAC), and benzethonium chloride (BZT); and (3) zwitterionic (amphoteric), for example, dodecyl betaine, cocamidopropyl betaine, and coco ampho glycinate.

Exemplary nonionic surfactants include, but are not limited to, alkyl poly(ethylene oxide), alkylphenol poly(ethylene oxide), copolymers of poly(ethylene oxide) and poly(propylene oxide) (commercially known as Poloxamers or Poloxamines), polyoxyethylene octyl phenyl ether (TRITON X-100®), alkyl polyglucosides, for example, octyl glucoside and decyl maltoside, fatty alcohols, for example, cetyl alcohol and oleyl alcohol, cocamide MEA, cocamide DEA, and polysorbates (commercially known as TWEEN 20, TWEEN 80), for example, dodecyl dimethylamine oxide.

Exemplary biological surfactants include, but are not limited to, micellular-forming surfactants or surfactants that form micelles in solution, for example, DNA, vesicles, phospholipids, and combinations thereof. In other embodiments, other additives may be used to direct the growth of the nanowires, such as polyethylene glycol or sodium citrate. In one embodiment, the electrolyte solution comprises polyethylene glycol at a weight percentage of 1-8 wt %, preferably 2-7 wt %, more preferably 3-6 wt % relative to a total weight of the electrolyte solution. However, in some embodiments, the electrolyte solution may comprise polyethylene glycol at a weight percentage less than 1 wt % or greater than 8 wt % relative to a total weight of the electrolyte solution. The polyethylene glycol may have a weight average molecular weight of 0.2-500 kDa, preferably 1-300 kDa, more preferably 2-100 kDa.

In a preferred embodiment, the electrolyte solution comprises both 0.3-0.8 M sodium fluoride and 1-8 wt % polyethylene glycol relative to a total weight of the electrolyte solution.

By incorporating at least one surfactant in the electrolyte, the nanowires or other nanostructures may become ordered, for example, by self-assembly. A surfactant or additive such as those listed above may be present in the electrolyte solution at a concentration of 1-500 mM, preferably 10-400 mM, more preferably 50-350 mM.

In one embodiment, the indium foil in contact with the electrolyte solution has a length to width ratio of 1:1-2.5:1, preferably 1:1-2:1, more preferably 1:1-1.5:1, though in some embodiments, the indium foil may have a length to width ratio of greater than 2.5:1.

Preferably, in these embodiments, the indium foil is square or rectangular, though other shapes with curved and/or straight edges are possible. In one embodiment, the indium foil may have a length or longest dimension of 0.4-10 cm, preferably 0.5-5 cm, more preferably 0.8-1.2 cm. In one embodiment, the indium foil may have a width of 0.1-1.5 cm, preferably 0.2-1.0 cm, more preferably 0.3-0.6 cm. In one embodiment, the indium foil may have a thickness of 0.001-4.00 mm, preferably 0.1-1.0 mm, more preferably 0.2-0.8 mm. However, in some embodiments, the indium foil may have a longest dimension greater than 10 cm or smaller than 0.4 cm, a width greater than 1.5 cm or smaller than 0.1 cm, and/or a thickness smaller than 0.001 mm or greater than 4.00 mm. The indium foil may be substantially planar, or may be curved or rolled into a tube or scroll. Preferably the indium foil is substantially planar. In alternative embodiments, the indium foil may be in a different form, such as a rod, wire, ring, disc, bead, mesh, perforated sheet, multi-layered foil, or some other shape. In one embodiment, the indium foil may comprise an outer layer of indium attached to a layer of a different material. For instance, the indium foil may comprise a layer of indium deposited on a glass coverslip.

In one embodiment, the working electrode in contact with the electrolyte solution consists of indium foil and no other metal. However, in some embodiments, the indium foil may not comprise 100% indium, but may comprise 3 wt % or less, 2 wt % or less, preferably 1 wt % or less of impurities, such as other metals, metal oxides, and adsorbed organic materials. In alternative embodiments, the working electrode may be an alloy comprising indium, such as indium tin oxide (ITO), an alloy of indium and chromium, or an alloy of indium and zinc.

In an alternative embodiment, other metals may be used in the anodization method to create nanostructures comprising different metal oxides. These metals may be aluminum, titanium, magnesium, zinc, niobium, tantalum, cadmium, tin, gallium, thallium, lead, antimony, tungsten, zirconium, ruthenium, barium, selenium, bismuth, alloys thereof, or some other metal.

In one embodiment, the working electrode may be perforated, scratched, polished, etched, or modified in some other way before the subjecting. In another embodiment, the working electrode may be cleaned with a solvent such as, for example, acetone or ethanol and/or a detergent such as an industrial detergent of TFD4 type. This cleaning may be carried out in an ultrasonication bath. In other embodiments, cleaning may involve UV irradiation or exposure to argon plasma and/or oxygen plasma. These cleaning steps may be used to avoid contamination by external agents such as organic pollutants.

During the anodization process, the current density drawn on the working electrode surface may be 1-1,000 mA/cm$^2$, preferably 5-600 mA/cm$^2$, more preferably 10-300 mA/cm$^2$, however, in some embodiments, the current density may be less than 1 mA/cm$^2$ or greater than 1,000 mA/cm$^2$. In other embodiments, the voltage or the exposed surface area of the electrode may be adjusted in order to achieve a certain current density.

In an alternative embodiment, the $In_2O_3$ nanoarray may be formed by lithography, more preferably nanolithography. Nanolithography techniques may be categorized as in series or parallel, mask or maskless/direct-write, top-down or bottom-up, beam or tip-based, resist-based or resist-less methods all of which are acceptable in terms of the present disclosure. Exemplary nanolithography techniques include, but are not limited to, optical lithography, photolithography, directed self-assembly, extreme ultraviolet lithography, electron beam lithography, electron beam direct write lithography, multiple electron beam lithography, nanoimprint lithography, step-and-flash imprint lithography, multiphoton lithography, scanning probe lithography, dip-pen nanolithography, thermochemical nanolithography, thermal scanning probe lithography, local oxidation nanolithography, molecular self-assembly, stencil lithography, X-ray lithography, laser printing of single nanoparticles, magnetolithography, nanosphere lithography, proton beam writing, charged particle lithography, ion projection lithography, electron projection lithography, neutral particle lithography and mixtures thereof. In another alternative embodiment, the $In_2O_3$ nanoarray may be formed by a sol-gel or chemical vapor deposition method. In another alternative embodiment, the $In_2O_3$ nanoarray may be synthesized by two or more techniques, for instance, a nanolithography method and then an electrodeposition method.

In one embodiment, the counter electrode comprises gold, platinum, or carbon. In a further embodiment, the counter electrode comprises platinum. In one embodiment, the counter electrode and/or the working electrode may be in the form of a wire, a rod, a cylinder, a tube, a scroll, a sheet, a piece of foil, a woven mesh, a perforated sheet, or a brush. The counter electrode and/or the working electrode may be polished in order to reduce surface roughness or may be texturized with grooves, channels, divots, microstructures, or nanostructures. Similar to what was mentioned for the indium foil, the counter electrode may comprise impurities, an alloy comprising In, or other metals favorable to the anodization method.

In another further embodiment, where the counter electrode comprises platinum, the counter electrode is in the form of rod or wire. Alternatively, the counter electrode may comprise some other electrically-conductive material such as platinum-iridium alloy, iridium, titanium, titanium alloy, stainless steel, gold, cobalt alloy and/or some other electrically-conductive material, where an "electrically-conductive material" as defined here is a substance with an electrical resistivity of at most $10^{-6}$ Ω·m, preferably at most $10^{-7}$ Ω·m, more preferably at most $10^{-8}$ Ω·m at a temperature of 20-25° C. In another alternative embodiment, the working electrode may not comprise indium, but may comprise any of the previously mentioned metals.

In a preferred embodiment, the counter electrode has at least one outer surface comprising an essentially inert, electrically conducting chemical substance, such as platinum, gold, or carbon. In another embodiment, the counter electrode may comprise solid platinum, gold, or carbon. The form of the counter electrode may be generally relevant only in that it needs to supply sufficient current to the electrolyte solution to support the anodization current required for the formation of the $In_2O_3$ nanoarray in the anodization process. The material of the counter electrode should thus be sufficiently inert to withstand the chemical conditions in the electrolyte solution, such as acidic or basic pH values, without substantially degrading during the anodization process. The counter electrode preferably should not leach out any chemical substance that interferes with the anodization process or might lead to undesirable contamination of the $In_2O_3$ nanoarray formed during anodization.

In a further embodiment, where the counter electrode comprises platinum, the counter electrode may be in the form of a mesh. In one embodiment, the counter electrode in the form of a mesh may have a nominal aperture or pore diameter of 0.05-0.6 mm, preferably 0.1-0.5 mm, more preferably 0.2-0.4 mm, and/or a wire diameter of 0.01-0.5 mm, preferably 0.08-0.4 mm, more preferably 0.1-0.3 mm. In other embodiments, the counter electrode may be considered a gauze with a mesh number of 40-200, preferably 45-150, more preferably 50-100. In other embodiments, the counter electrode may be in the form of a perforated sheet or a sponge. In one embodiment, the counter electrode may be in the form of a mesh with one or more bulk dimensions (length, width, or thickness) as previously described for the indium foil working electrode. In a further embodiment, the counter electrode may be in the form of a mesh with similar a length and width as described for the indium foil working electrode.

In one embodiment, the counter electrode is in the form of a rod or wire. The rod or wire may have straight sides and a circular cross-section, similar to a cylinder. A ratio of the length of the rod or wire to its width may be 1,500:1-1:1, preferably 500:1-2:1, more preferably 300:1-3:1, even more preferably 200:1-4:1. The length of the rod or wire may be 0.5-50 cm, preferably 1-30 cm, more preferably 3-20 cm, and a long wire may be coiled or bent into a shape that allows the entire wire to fit into an electrochemical cell. The diameter of the rod or wire may be 0.5-20 mm, preferably 0.8-8 mm, more preferably 1-3 mm. In some embodiments, a rod may have an elongated cross-section, similar to a ribbon or strip of metal.

In other embodiments, the electrochemical cell comprises a reference electrode as a third electrode. A reference electrode is an electrode which has a stable and well-known electrode potential. The high stability of the electrode potential is usually reached by employing a redox system with constant (buffered or saturated) concentrations of each relevant species of the redox reaction. A reference electrode may enable a potentiostat to deliver a stable voltage to the working electrode or the counter electrode. The reference electrode may be a standard hydrogen electrode (SHE), a normal hydrogen electrode (NHE), a reversible hydrogen electrode (RHE), a saturated calomel electrode (SCE), a copper-copper(II) sulfate electrode (CSE), a silver chloride electrode, a pH-electrode, a palladium-hydrogen electrode, a dynamic hydrogen electrode (DHE), a mercury-mercurous sulfate electrode, or some other type of electrode. In a preferred embodiment, a reference electrode is present and is a saturated calomel electrode (SCE). However, in some embodiments, the electrochemical cell does not comprise a third electrode.

In one embodiment, the potential may be applied to the electrodes by a battery, such as a battery comprising one or more electrochemical cells of alkaline, lithium, lithium-ion, nickel-cadmium, nickel metal hydride, zinc-air, silver oxide, and/or carbon-zinc. In another embodiment, the potential may be applied through a potentiostat or some other source of direct current, such as a photovoltaic cell. In one embodiment, a potentiostat may be powered by an AC adaptor, which is plugged into a standard building or home electric utility line. In one embodiment, the potentiostat may connect with a reference electrode in the electrolyte solution. Preferably the potentiostat is able to supply a relatively stable voltage. For example, in one embodiment, the electrochemical cell is subjected to a voltage that does not vary by more than 5%, preferably by no more than 3%, preferably by no more than 1.5% of an average value throughout the subjecting. In another embodiment, the voltage may be modulated, such as being increased or decreased linearly, being applied as pulses, or being applied with an alternating current.

In one embodiment, the $In_2O_3$ nanoarray produced by the first aspect of the disclosure may be used to receive light within a photo-electrochemical cell. A photo-electrochemical cell may be as simple as an electrochemical cell that has a transparent window to allow electromagnetic radiation to reach the electrode of interest. Alternatively, a photo-electrochemical cell may be enclosed in a flat, transparent housing so that the photo-active electrode has a greater surface area facing an irradiation source. A photo-electrochemical cell may be used with mirrors, lenses, shutters, optical filters, optical fibers, or other optical devices in order to modulate or direct an incoming electromagnetic radiation. The incoming electromagnetic radiation may have a wavelength of 200-700 nm, preferably 250-600 nm, more preferably 300-500 nm, even more preferably 360-420 nm. Preferably the incoming electromagnetic radiation comprises one or more wavelengths that have an energy equivalent or greater than the band gap energy of the $In_2O_3$ nanoarray. For example, the incoming electromagnetic radiation may have one or more wavelengths of 10-395 nm, preferably 150-300 nm, more preferably 200-250 nm, where wavelengths in the range of 10-400 nm may be considered UV radiation. In one embodiment, the photo-electrochemical cell includes water in contact with the $In_2O_3$ nanoarray. In a further embodiment, the water may be present in an aqueous electrolyte solution.

In an alternative embodiment, the $In_2O_3$ nanoarray may be used in the field of batteries, fuel cells, hydrogen sensors, semiconductors (such as field effect transistors), magnetic semiconductors, capacitors, data storage devices, biosensors (such as redox protein sensors), photovoltaics, liquid crystal screens, plasma screens, touch screens, OLEDs, antistatic deposits, optical coatings, reflective coverings, anti-reflection coatings, and/or reaction catalysis. Similarly, in one embodiment, the $In_2O_3$ nanoarray may be coated with another material. For example, the $In_2O_3$ nanoarray may be coated with a layer of gold. A gold-coated $In_2O_3$ nanoarray may then be used for analyte detection using surface enhanced Raman scattering (SERS).

In another embodiment, $In_2O_3$ nanoarray produced by the method of the first aspect may be used to decompose water into $H_2$ and $O_2$, which involves irradiating a photo-electrochemical cell as described above with an electromagnetic radiation having a wavelength of 200-700 nm, preferably 210-600 nm, more preferably 220-500 nm, even more preferably 250-420 nm, where the photo-electrochemical cell comprises water in contact with the $In_2O_3$ nanoarray. Preferably the source of the electromagnetic radiation is sunlight, though in some embodiments, the irradiation source may be a flame, a lantern, a gas discharge lamp (such as a xenon, sodium, or mercury vapor lamp), an incandescent bulb, a laser, a fluorescent lamp, an electric arc, a light emitting diode (LED), a cathode ray tube, or some other source of light.

The examples below are intended to further illustrate protocols for preparing, characterizing the $In_2O_3$ nanoarray, and uses thereof, and are not intended to limit the scope of the claims.

Example 1

Synthesis of Indium(III) oxide ($In_2O_3$) Nanoarrays By Anodization Method

Provided herein is a homogeneous, $In_2O_3$ nanoarray formed on a large area with uniform coverage. This $In_2O_3$ nanoarray is fabricated by a simple low voltage and room temperature anodization method. By fine-tuning the reaction parameters of the anodization method, the morphology of the $In_2O_3$ nanoarray may be precisely tailored.

The main aspect of this invention is the one step fabrication method of an $In_2O_3$ nanoarray on an indium foil substrate via anodization/etching in an electrolytic solution. The current passes between two electrodes in contact with an electrolyte solution. The voltage and current may be changed according to the resulting surface anodization. Additional features of the invention will become ostensible from the following description.

Features of the invention are now described with reference to FIGS. 1 to 6B. These figures describe, using common reference numerals, components and other features of the $In_2O_3$ nanoarray, the electrochemical cell, and methods of use.

FIG. 1 shows the anodization or electrochemical cell 8 of the present invention. The electrochemical cell 8 comprises the electrodes 2, 3, 4, electrolyte solution 7, and magnetic stirrer 5, which are all held in a non-conducting, non-reactive vessel.

For the operation of the electrochemical cell 8 for the anodization of the indium foil and creation of the $In_2O_3$ nanoarray, the potentiostat 1 applies a constant voltage of 20 V across the working electrode 3 and the counter electrode 4 at room temperature, using a saturated calomel electrode (SCE) 2 as a reference electrode. Indium (In) foil (0.5 cm×1 cm) serves as the working electrode 3. A platinum (Pt) wire electrode is used as a counter electrode 4. A magnetic stir bar 5 is rotated with the help of a magnetic stir plate 6 to stir the electrolyte solution 7, keeping the concentration homogeneous throughout the course of the anodization method. Here, the electrolyte solution 7 comprises 0.5 M NaF and 5% polyethylene glycol in water and is in contact with all three electrodes 2, 3, 4. The stir plate is not heated.

Figure 2:
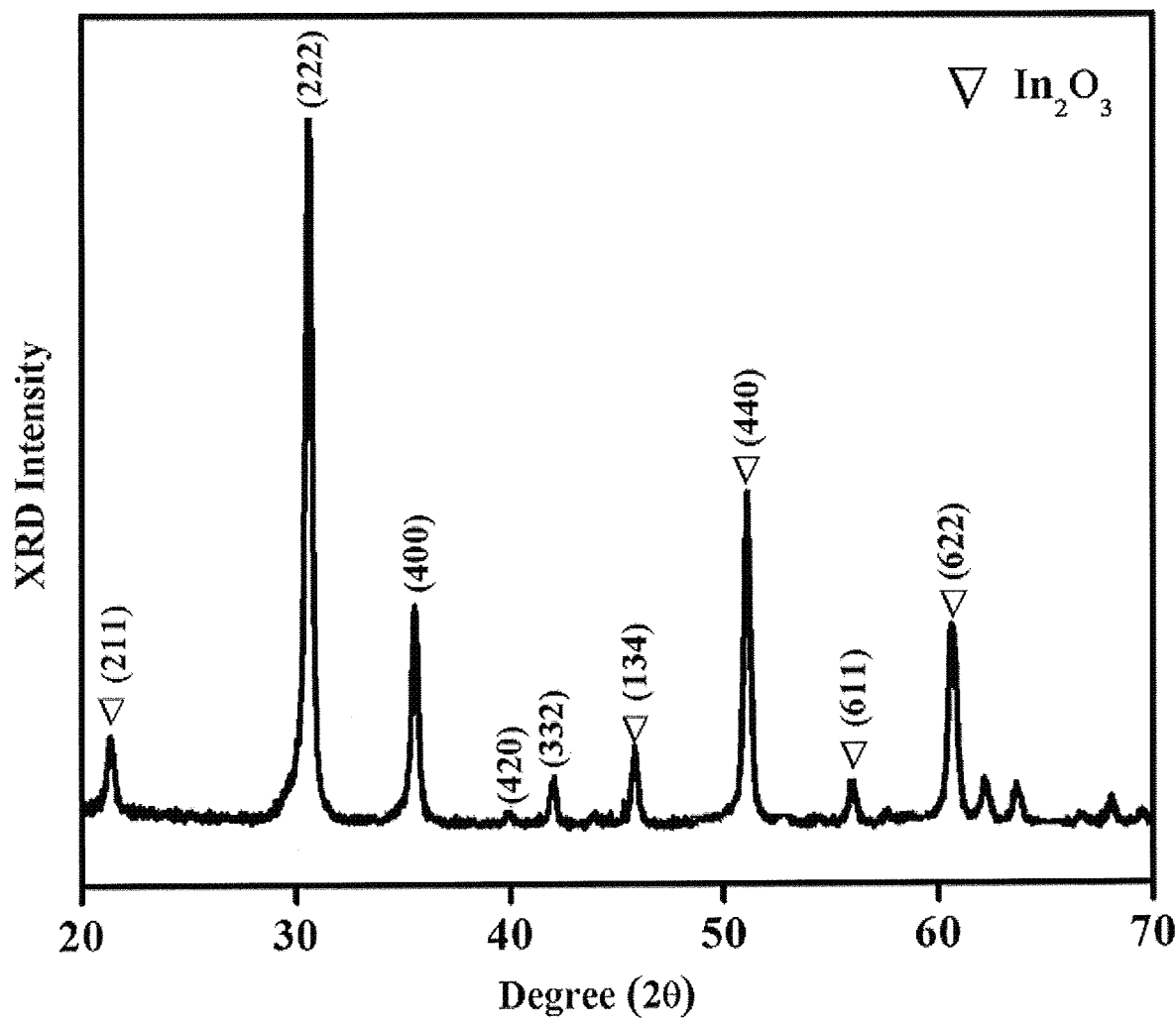
FIG. 2 is an X-ray diffraction (XRD) pattern of the $In_2O_3$ nanoarray.

FIG. 2 is an X-ray diffraction (XRD) pattern of the $In_2O_3$ nanoarray, used to determine the crystallinity and phase purity of the $In_2O_3$. The peaks were indexed and compared with a database. A characteristic (222) peak at $2\theta=30°$ indicates the formation of cubic $In_2O_3$, as a (222) lattice is the dominant facet of the formed product. This peak was used to calculate the average $In_2O_3$ nanowire thickness of 30 nm, by employing the Debye-Scherrer equation [Patterson, A. L. *Phys Rev* 56 (1939) 978-incorporated herein by reference in its entirety].

Other characteristic XRD peaks are observed at $2\theta=23°$, 38°, 44°, 47.5°, 53°, and 63°. These peaks can be indexed, respectively, to the (211), (411), (332), (431), (611), and (622) crystal planes of the cubic crystal $In_2O_3$. The XRD peaks are matched with JCPDS card #06-0416.

Figure 3A:
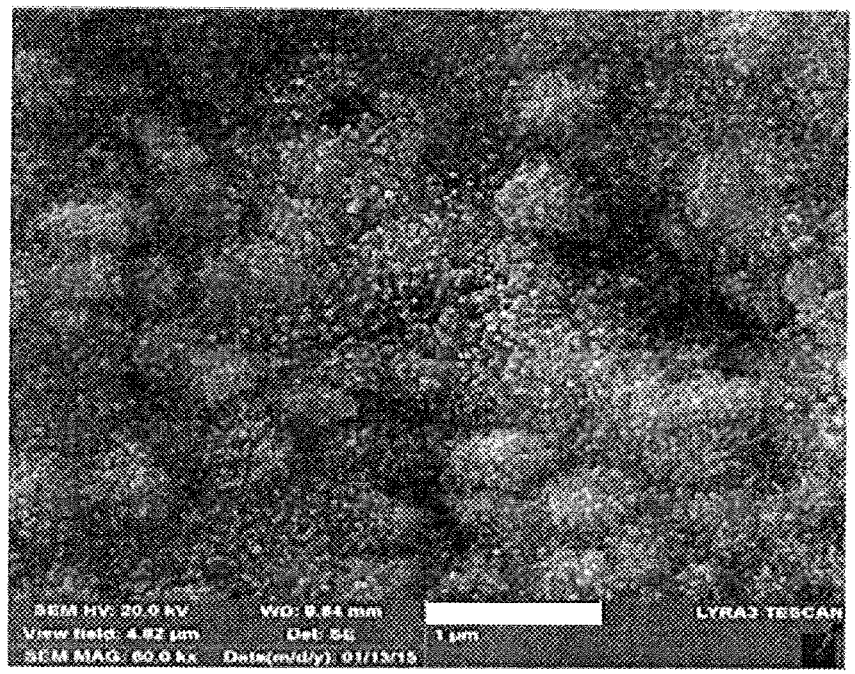
FIG. 3A is a field emission scanning electron microscope (FESEM) image of the $In_2O_3$ nanoarray with a scale bar of 1 μm.
Figure 3B:
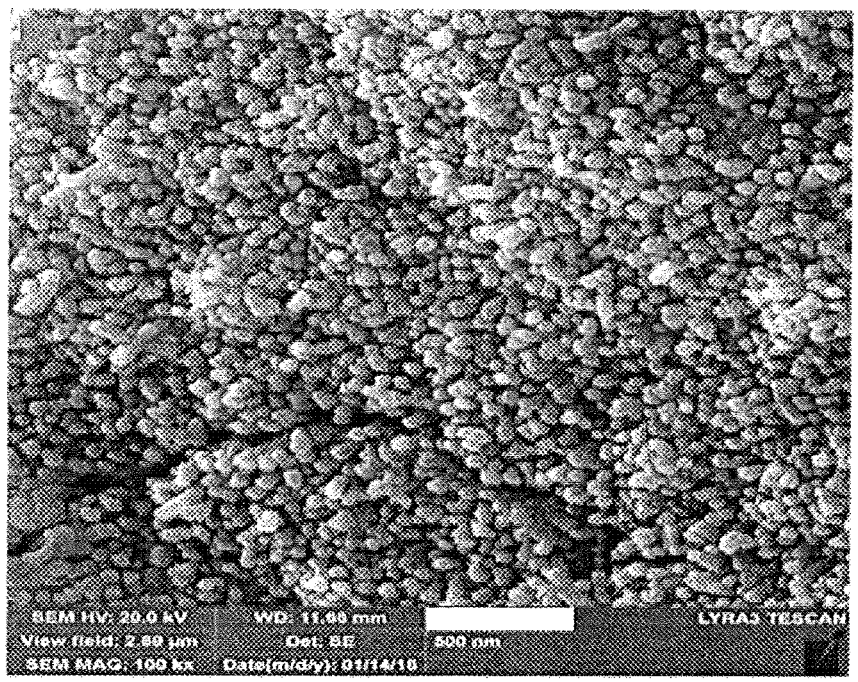
FIG. 3B is a FESEM image of the $In_2O_3$ nanoarray with a scale bar of 500 nm.
Figure 3C:
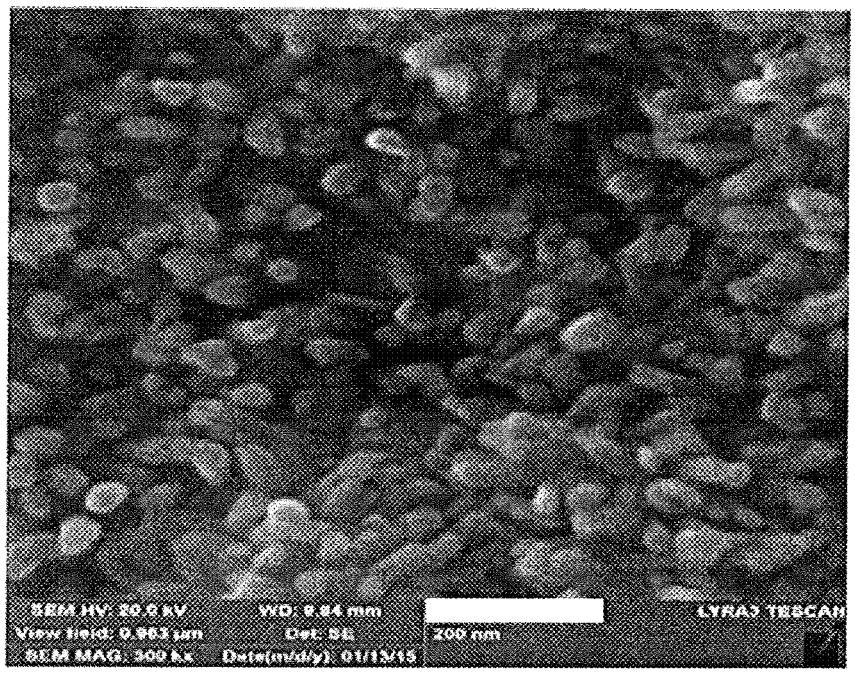
FIG. 3C is a FESEM image of the $In_2O_3$ nanoarray with a scale bar of 200 nm.
Figure 3D:
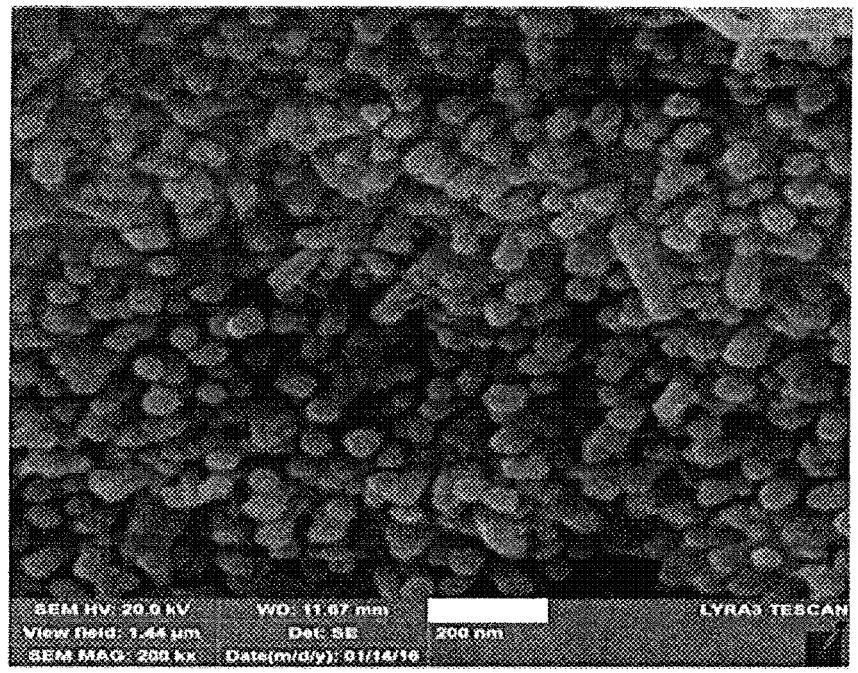
FIG. 3D is another FESEM image of the $In_2O_3$ nanoarray with a scale bar of 200 nm.

FIGS. 3A and 3B show field emission scanning electron microscope (FESEM) images of $In_2O_3$ nanoarrays, with scale bars of 1 μm and 500 nm, respectively. FIGS. 3C and 3D also show FESEM images of nanoarrays, both images with scale bars of 200 nm. These micrographs clearly indicate the uniform one dimensional (1D) growth of the nanowires over the surface of the metallic indium substrate. The thickness of an individual nanowire is about 30-40 nm. Such small-sized nanowires can be helpful in various applications due to their large surface area to volume ratios.

Figure 4:
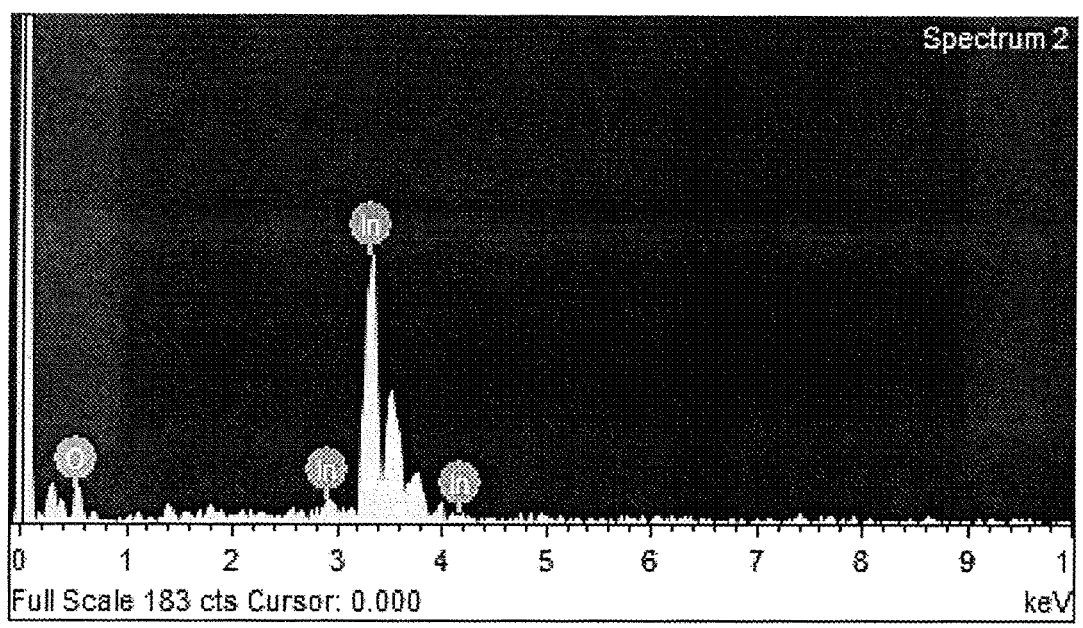
FIG. 4 is an energy-dispersive X-ray (EDX) spectrum of the $In_2O_3$ nanoarray.

FIG. 4 is an energy-dispersive X-ray (EDX) spectrum of the $In_2O_3$ nanoarray, which shows peaks related to indium and oxygen only. The smaller peaks at 3-4 keV are related to the metal coating used for FESEM observations.

Figure 5:
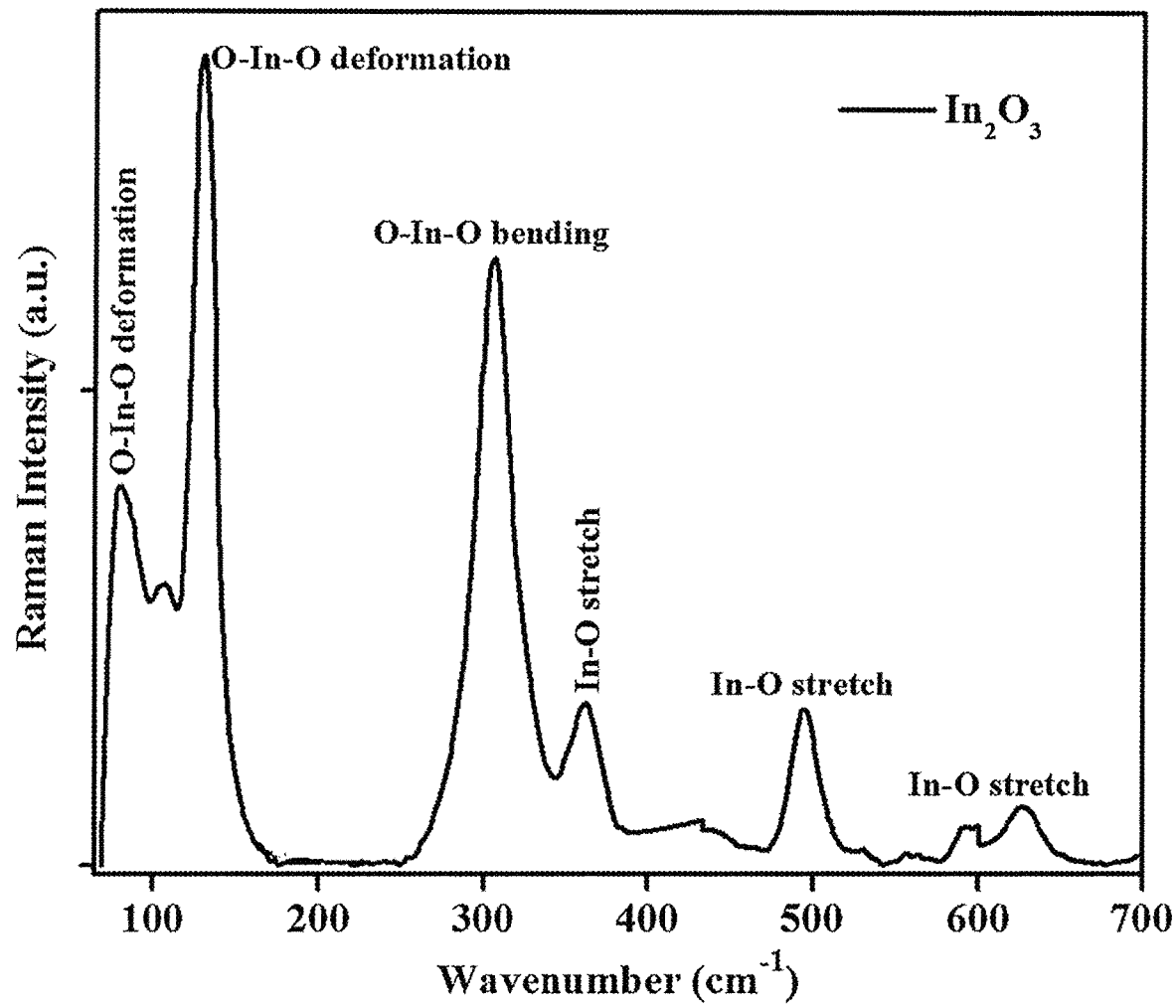
FIG. 5 is a Raman spectrum of the $In_2O_3$ nanoarray.

FIG. 5 is a Raman spectrum of $In_2O_3$ nanoarray. The Raman spectrum of $In_2O_3$ has been reported to show characteristic peaks in the lower vibrational region of 50 to 700 $cm^{-1}$, so it is widely known that the cubic crystal structure of $In_2O_3$ relates to the $I^3_a$, $T^1_h$ space group. For such space groups the most Raman active symmetries are $A_g$, $E_g$, and $T_g$, while the remaining $T_a$ vibrations are IR active. The $In_2O_3$ Raman spectrum shows the expected phonons at 79 $cm^{-1}$ (medium), 129.5 $cm^{-1}$ (very strong), 189 $cm^{-1}$ (weak), 210 $cm^{-1}$ (weak), and 307 $cm^{-1}$ (strong), followed by weak peaks at 363.5 $cm^{-1}$, 413 $cm^{-1}$, 493 $cm^{-1}$, and a medium peak at 628 $cm^{-1}$. The presence of intense phonons in the Raman spectra of $In_2O_3$ nanowires is associated with the excitation of the $A_g$, $E_g$, and $T_g$ vibrational modes.

Figure 6A:
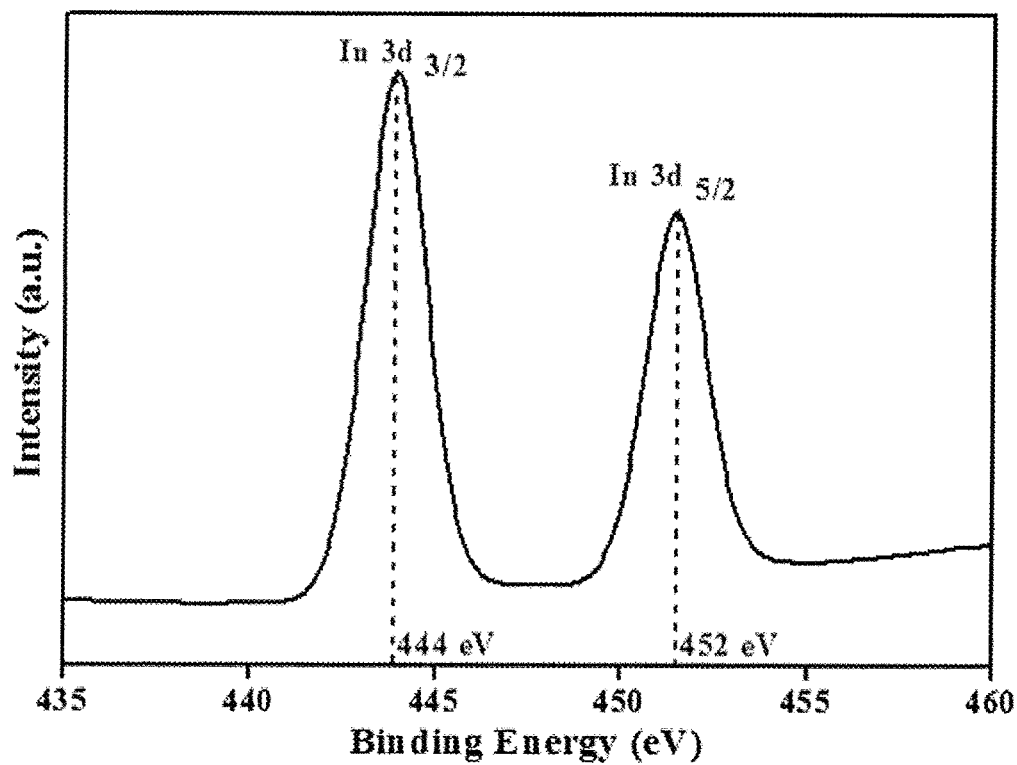
FIG. 6A is an X-ray photoelectron spectroscopy (XPS) spectrum of the $In_2O_3$ nanoarray showing signals from In electrons.
Figure 6B:
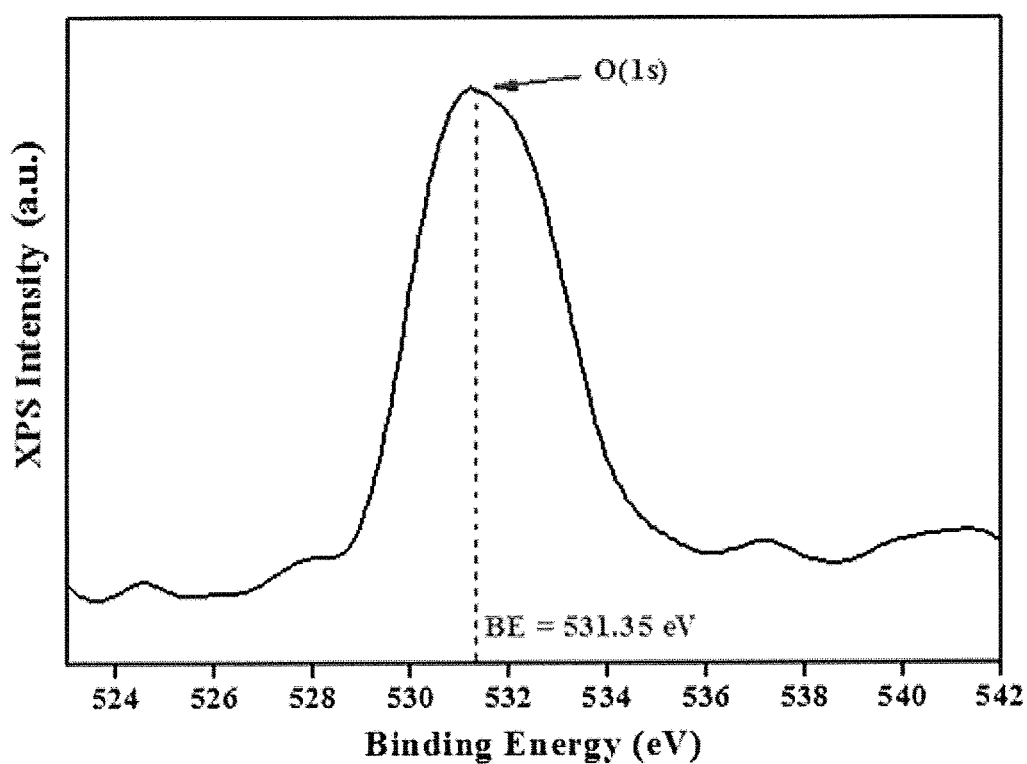
FIG. 6B is an XPS spectrum of the $In_2O_3$ nanoarray showing a signal from $O^{-2}$ electrons.

FIGS. 6A and 6B are X-ray photoelectron spectroscopy (XPS) spectra of the $In_2O_3$ nanoarray. The spectrum in FIG. 6A shows the characteristic doublets of In at $3d_{3/2}$ and $3d_{5/2}$ in the energy range of 443-455 eV due to spin orbital splitting. The spectrum in FIG. 6B shows the characteristic single peak for oxygen, which may be attributed to the oxygen anion of the indium oxide.

FIG. 7A shows a UV-Vis absorption spectrum of pure $In_2O_3$ and gold-coated $In_2O_3$. FIG. 7B is a band gap calculated spectrum being used to determine band gap energies. The UV-Vis results of FIG. 7A show strong absorbance of pure $In_2O_3$ below 300 nm, while the band gap energy was found at 3.13 eV in FIG. 7B.

The above experimental description discloses a single step method for the electrochemical synthesis of $In_2O_3$ nanoarrays on a large area of an indium substrate and with a high reproducibility. The method uses an indium metal substrate as the working electrode, and electrochemical reactions produce a growth of $In_2O_3$ nanoarrays from this substrate. The method uses a low voltage to produce highly uniform arrays of $In_2O_3$ nanostructures, which may be used in electronic components.

The invention claimed is:

1. A method for making an $In_2O_3$ nanoarray photo-electrochemical cell and splitting water to form $H_2$ and $O_2$, comprising:
    subjecting an electrochemical cell to 15-25 V to anodize an indium foil, the electrochemical cell comprising:
        a working electrode comprising indium foil in contact with an electrolyte solution,
    a reference electrode, and
        a counter electrode in contact with the electrolyte solution,
        wherein nanowires of $In_2O_3$ are grown on the indium foil, forming the $In_2O_3$ nanoarray,
        wherein an end of each nanowire is attached to the indium foil, and
        wherein the longitudinal axis of each nanowire is substantially perpendicular to the indium foil, then
    placing the $In_2O_3$ nanoarray in a photo-electrochemical cell to make the photo-electrochemical cell and adding water; and irradiating the photo-electrochemical cell containing the water and the $In_2O_3$ nanoarray to form $H_2$ and $O_2$ by splitting the water.

2. The method of claim 1, wherein the $In_2O_3$ nanoarray has a band gap energy of 2.63-3.63 eV.

3. The method of claim 1, wherein the electrolyte solution has a temperature of 20-30° C.

4. The method of claim 1, wherein the electrolyte solution comprises polyethylene glycol at a weight percentage of 1-8 wt % relative to a total weight of the electrolyte solution.

5. The method of claim 1, wherein the electrolyte solution comprises one or more electrolytes at a concentration of 0.2-1.0 M.

6. The method of claim 1, wherein the electrolyte solution comprises at least one electrolyte selected from the group consisting of chromic acid, oxalic acid, sulfuric acid, phosphoric acid, ammonium fluoride, and sodium fluoride.

7. The method of claim 1, wherein before the subjecting, the electrolyte solution is substantially free of an aqueous form of In.

8. The method of claim 1, wherein the electrochemical cell is subjected to a voltage that does not vary by more than 5% of an average value throughout the subjecting.

9. The method of claim 1, wherein the indium foil in contact with the electrolyte solution has a length to width ratio of 1:1-2.5:1.

* * * * *